United States Patent [19]

Crafts et al.

[11] Patent Number: 5,536,968

[45] Date of Patent: Jul. 16, 1996

[54] POLYSILICON FUSE ARRAY STRUCTURE FOR INTEGRATED CIRCUITS

[75] Inventors: Harold S. Crafts, Colorado Springs; William W. McKinley, Fort Collins; Mark O. Scaggs, Parker, all of Colo.

[73] Assignees: AT&T Global Information Solutions Company, Dayton, Ohio; Hyundai Electronics America, Milpitas, Calif.; Symbios Logic Inc., Fort Collins, Colo.

[21] Appl. No.: 291,326

[22] Filed: Aug. 16, 1994

Related U.S. Application Data

[63] Continuation of Ser. No. 992,955, Dec. 18, 1992, abandoned.

[51] Int. Cl.[6] ........................... H01L 29/00; H01L 29/80
[52] U.S. Cl. ................. 257/529; 257/258; 257/259
[58] Field of Search ................................ 257/258, 259, 257/529

[56] References Cited

U.S. PATENT DOCUMENTS 4,045,310  8/1977  Jones et al. .
5,053,999  10/1991  Matsumura et al. .

FOREIGN PATENT DOCUMENTS 0139958  8/1982  Japan .
0283163  12/1986  Japan .
0308361  12/1988  Japan .
0124047  5/1991  Japan .

Primary Examiner—Rolf Hille
Assistant Examiner—Valencia Martin Wallace
Attorney, Agent, or Firm—Wayne P. Bailey; James M. Stover

[57] ABSTRACT

A programmable read only memory (PROM) including an array of polysilicon fuse elements. The fuse array is formed within a semiconductor substrate including first and second patterned signal layers electrically insulated from one another. Each polysilicon fuse element within the array connects a first electrical conductor residing in the first patterned signal layer with a second electrical conductor residing in the second patterned signal layer. The polysilicon fuse element is in the form of a narrow strip and is folded in order to cause a current flowing through the clement to crowd, lowering the amount of current required to heat the fuse element to its melting point, i.e. the threshold current. The PROM is programmed by passing a threshold current through selected fuse elements.

13 Claims, 3 Drawing Sheets

POLYSILICON FUSE ARRAY STRUCTURE FOR INTEGRATED CIRCUITS

This is a continuation of application Ser. No. 07/992,955, filed on Dec. 18, 1992, now abandoned.

The present invention relates to programmable read only memory (PROM) devices and, more particularly, to a fuse array structure for implementation within an integrated circuit.

BACKGROUND OF THE INVENTION

Computers and related electronic equipment typically employ a number of different types of data storage or memory devices. For example, a read only memory (ROM) is a semiconductor memory device in which data is permanently stored. The data cannot be overwritten or otherwise altered by the user. A ROM is also nonvolatile which means that the data is not destroyed when power is lost. A ROM is "programmed" during its manufacture by making permanent electrical connections in selected memory cells. ROMs are useful wherever unalterable data or instructions are required. A disadvantage of ROMs is that their programming is determined during the design stage and can only be varied by redesigning the chip.

An alternative to a ROM is a programmable read only memory (PROM) which is programmable once after its manufacture. In one type of PROM, each memory cell is provided with an electrical connection in the form of a fusible link. The PROM is "programmed" by opening or "blowing" the fusible link in selected cells. A PROM is frequently programmed at the factory; however, it is not uncommon for it to be programmed by the purchaser. A clear advantage of a PROM is that a single semiconductor design can have many different applications.

There are a considerable number of known designs for the fusible links used in PROMs. Perhaps the most common is a metal link, such as tungsten, which is narrowed or necked down in one region. To blow the fuse, current is driven through the link. The current heats the link to its melting point and the link is broken. Usually the link breaks in the necked down region because that is where the current density is highest.

One problem with the design of existing fusible links is that they usually call for a relatively high programming current. The requirement for high current can affect the basic manufacturing process for the PROM. For example, a popular process is one which produces MOS transistors in a CMOS configuration. Another process is one which produces bipolar transistors. It is costly to integrate CMOS and bipolar designs into a single process so it is generally preferred to use either a CMOS or bipolar process, but not both. However, to obtain the high current required to blow a metallic fusible link, bipolar technology is generally required. This means that a CMOS PROM design will require bipolar transistors to drive the programming current.

Another problem with existing fuse designs is that certain fuse metals, such as tungsten, require a specialized process to properly deposit them on a chip. As with bipolar transistors, different or specialized processes increase the cost of chip manufacture.

A further problem with existing fuse designs is referred to as "grow back" or "metal migration". Grow back is a phenomenon in which a fuse metal which has been blown experiences migration under high electric fields to restore the blown fusible link. Grow back alters the data stored in the PROM—clearly an undesirable result.

A cost effective fuse array structure for a PROM having reduced current requirements for programming and reduced incidence of fuse grow back is desired.

OBJECTS OF THE INVENTION

It is therefore an object of the present invention to provide a new and useful semiconductor fuse structure.

It is a further object of the present invention to provide a CMOS semiconductor fuse structure.

It is yet another object of the present invention to provide a fuse which requires relatively low power to program.

It is yet a further object of the present invention to provide a semiconductor fuse which resists grow back.

It is still another object of the present invention to provide a fuse structure which may be manufactured by a conventional CMOS process.

It is also an object of the present invention to provide a new and useful semiconductor fuse array structure.

It is a further object of the present invention to provide a new and useful programmable read only memory (PROM) implemented with polysilicon fuse elements.

SUMMARY OF THE INVENTION

There is provided, in accordance with the present invention, a semiconductor fuse structure comprising: a first electrical conductor; a second electrical conductor separated from the first electrical conductor by an insulator; and a polysilicon fuse element connecting the first and second electrical conductors. The polysilicon fuse element is in the form of a narrow strip and is folded in order to cause a current flowing through the element to crowd, lowering the amount of current required to heat the fuse element to its melting point.

In the described embodiment, the fuse structure is part of a PROM. The PROM comprises a semiconductor substrate having a first patterned signal layer, the first electrical conductor and polysilicon strip residing in the first patterned signal layer; a second patterned signal layer electrically insulated from the first patterned signal layer, the second electrical conductor residing in the second patterned signal layer; and a plated via connecting the second electrical conductor to one end of the polysilicon fuse element. A plurality of fuse structures arranged in an array are included in the PROM.

The above and other objects, features, and advantages of the present invention will become apparent from the following description and the attached drawings wherein applicable reference numerals have been carried forward.

DETAILED DESCRIPTION OF THE PREFERRED EMBODIMENT

Figure 1:
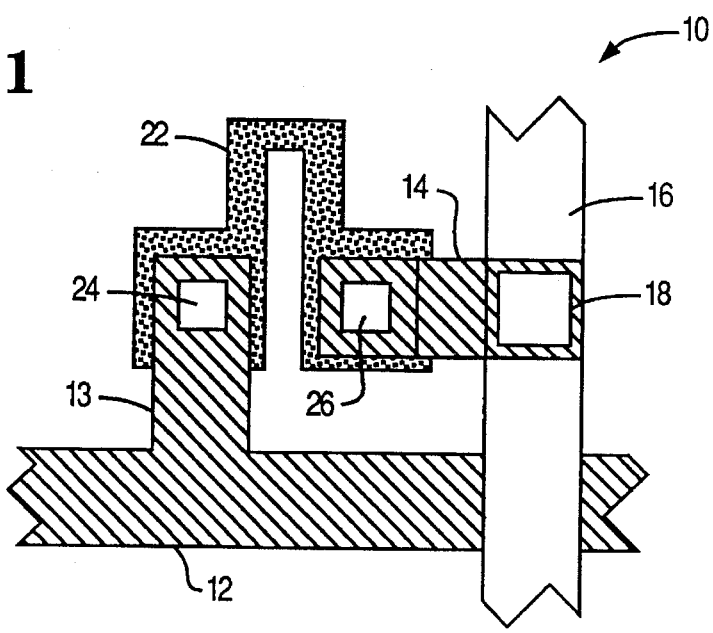
FIG. 1 is a plan view of a fuse element for a fuse array PROM in accordance with one form of the present invention.

A plan view of a preferred embodiment of a fuse structure 10 for incorporation into a fuse array PROM is shown in FIG. 1. It will be appreciated that fuse structure 10 is but a single element on a much larger integrated circuit including an array of fuse structures which forms the core of a programmable read-only memory. Fuse structure 10 connects a first metal conductor 12 with a second metal conductor 16. Metal conductor 12 resides in a first metal pattern layer, referred to as metal layer 1, which is electrically insulated from metal conductor 16, which resides in a second metal pattern layer, referred to as metal layer 2. The construction and formation of metal pattern layers, electrically insulated from one another in different planes within a semiconductor substrate, is conventional and well known in the semiconductor arts.

The primary component of fuse structure 10 is a polysilicon fuse element 22. The polysilicon fuse element is formed in a narrow strip which is folded in half. One end of fuse element 22 is connected by a polysilicon-metal contact 24 and metal conductor 13 to metal conductor 12. The remaining end of fuse element 22 is connected by a polysilicon-metal contact 26, metal conductor 14, and plated-up via 18 to metal conductor 16. Metal conductors 13 and 14 are formed with metal pattern layer 1, conductor 13 being a tap to conductor 12.

In operation, fuse element 22 is opened by driving a current from metal conductor 16 through the fuse element 22 and out to conductor 12. When sufficient programming current is provided, fuse element 22 will open.

Polysilicon is utilized as the material for fuse element 22 for two reasons. First, the relatively high resistance of a polysilicon element verses a standard aluminum fuse element reduces the amount of current which must be supplied to open the element during programming. The shape of fuse element, i.e., folded in half, causes programming current to crowd along the inside edge of the fuse element, further reducing the threshold current required to open the fuse element.

Second, polysilicon is a refractory material which is physically very stable at room temperature and therefor not subject to the metal migration or re-grow problems associated with metal fuse elements.

Figure 2:
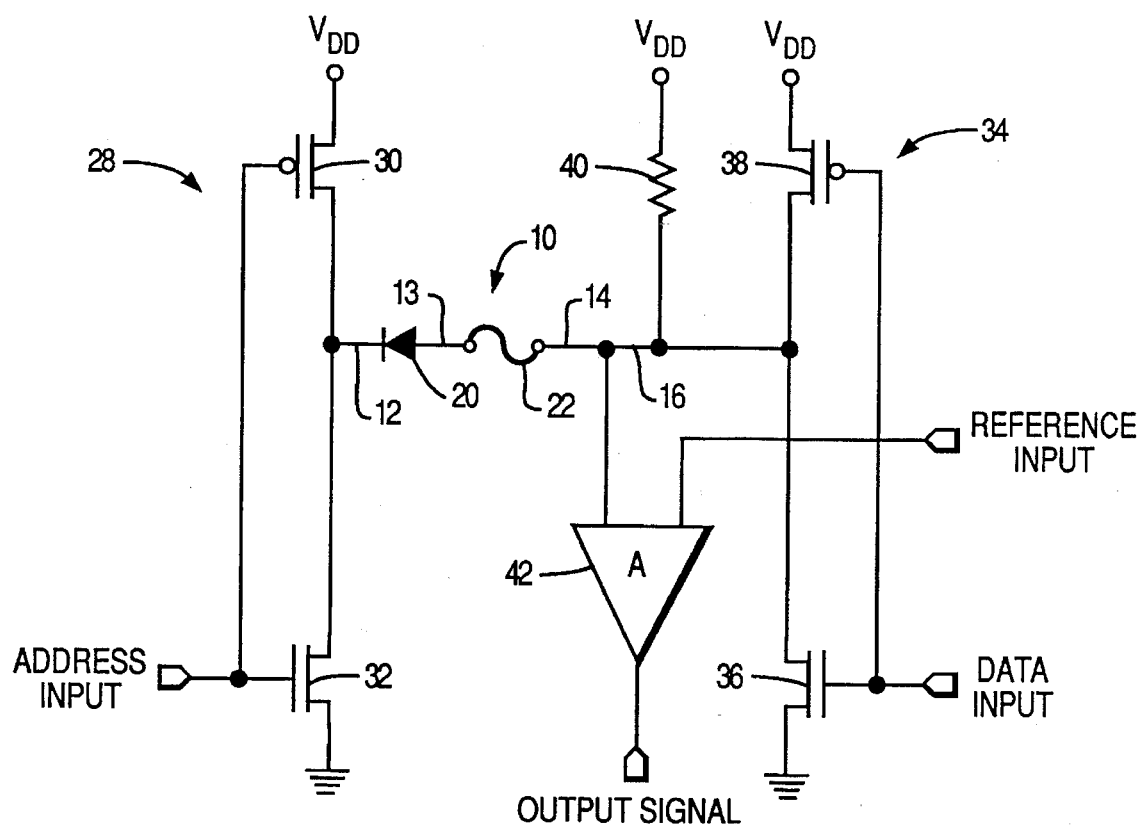
FIG. 2 is a schematic diagram of a circuit for sensing and programming the fuse element shown in FIG. 1.

FIG. 2 provides a schematic diagram of a circuit for sensing and programming the fuse element shown in FIG. 1. The structure shown includes a data input driver 34 connected to metal conductor 16, a pull-up resistor 40 connecting high voltage source $V_{DD}$ to conductor 16, an address input driver 28 connected to metal conductor 12, and a sense amplifier 42 connected to conductor 16.

Data input driver 34 includes a PMOS transistor 38 connected between high voltage source $V_{DD}$ and conductor 16 and an NMOS transistor 36 connected between conductor 16 and a low voltage source or ground. The gates of both transistors 36 and 38 are connected to receive a data input signal. Address input driver 28 is similarly constructed including a PMOS transistor 30 connected between high voltage source $V_{DD}$ and conductor 12 and an NMOS transistor 32 connected between conductor 12 and ground. The gates of both transistors 30 and 32 are connected to receive an address input signal To program fuse element 22, the element is first selected by applying a high voltage or logic one to the input to address input driver 28. A high voltage applied to address input driver 28 turns on NMOS transistor 32, grounding conductor 16. To program fuse element 22 to a logic one state, a high voltage or logic one is also applied to the input to data input driver 34. A high voltage applied to the data input to driver 34 turns on NMOS transistor 36, grounding conductor 16 and preventing current flow through fuse structure 10. The fuse element is thereby left intact.

To program fuse element 22 to a logic zero state, a low voltage or logic zero is applied to the input to data input driver 34. A low voltage applied to the data input to driver 34 turns on PMOS transistor 36, connecting conductor 16 with high voltage source $V_{DD}$. The current flow from voltage source $V_{DD}$ through PMOS transistor 38, fuse element 22 and NMOS transistor 32 to ground causes heating in element 22 which results in blowing or opening the fuse element.

When not selected for programming, a low voltage, or logic zero state, is applied to the input to address input driver 28. A low voltage applied to address input driver 28 turns on PMOS transistor 30, connecting conductor 12 with high voltage source $V_{DD}$. A decoupling diode 20, not shown in FIG. 1, is provided between fuse element 22 and conductor 12 to prevent current flow from metal conductor 12 through fuse element 22 to conductor 16.

The state of the fuse element after programming is sensed by applying a high voltage to the address input of driver 28 and to the reference input of sense amplifier 42. A second input of sense amplifier 42 is connected to conductor 16. If fuse element 22 is intact, this second input is connected through the fuse element and NMOS transistor 32 to ground voltage and the output of sense amplifier 42 is a logic zero. If fuse element 22 is open, the second input to sense amplifier 42 is connected through resistor 40 to high voltage source $V_{DD}$ and the output of sense amplifier 42 is a logic one. Current through element 22 is limited by resistor 40 during the sensing operation.

Figure 3:
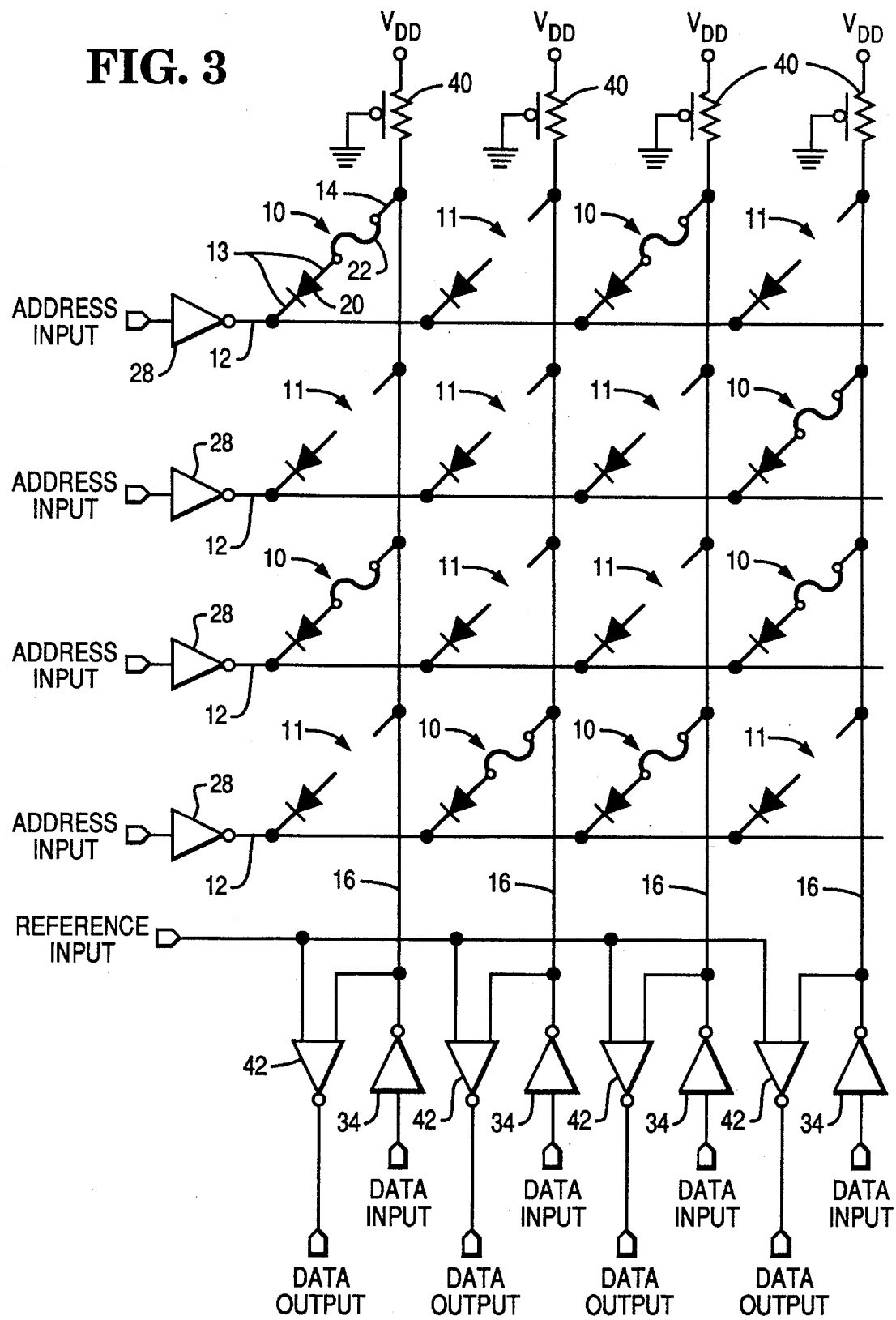
FIG. 3 is a schematic diagram of a fuse array PROM employing the fuse elements shown in FIG. 1 and the circuit structure illustrated in FIG. 2.

FIG. 3 is a schematic diagram of a simple fuse array PROM employing the fuse elements shown in FIG. 1 and the circuit structure illustrated in FIG. 2. The fuse array includes sixteen fuse structures arranged in four rows and four columns. Fuse structures with intact fuse elements are identified with reference numeral 10, while fuse structures with open fuse elements are identified by reference numeral 11. Four metal layer 1 conductors 12 and four metal layer 2 conductors 16 are shown. Each row of fuse structures are connected to a common metal conductor 12 and each column of fuse structures are connected to a common metal conductor 16. Each fuse element is connected to its associated conductor 12 through a decoupling diode 22 to prevent interaction between the elements.

Each one of address input drivers 28 selects a row of fuse structures for programming or sensing as described above. For the four by four fuse array shown in FIG. 3, four fuse structures will be programmed or read simultaneously. The fuse array matrix may be expanded to include more than the sixteen fuse structures shown in FIG. 3. For example, a more practical sized PROM may include 1024 fuse structures arranged to form 32, 32 bit words.

Figure 4:
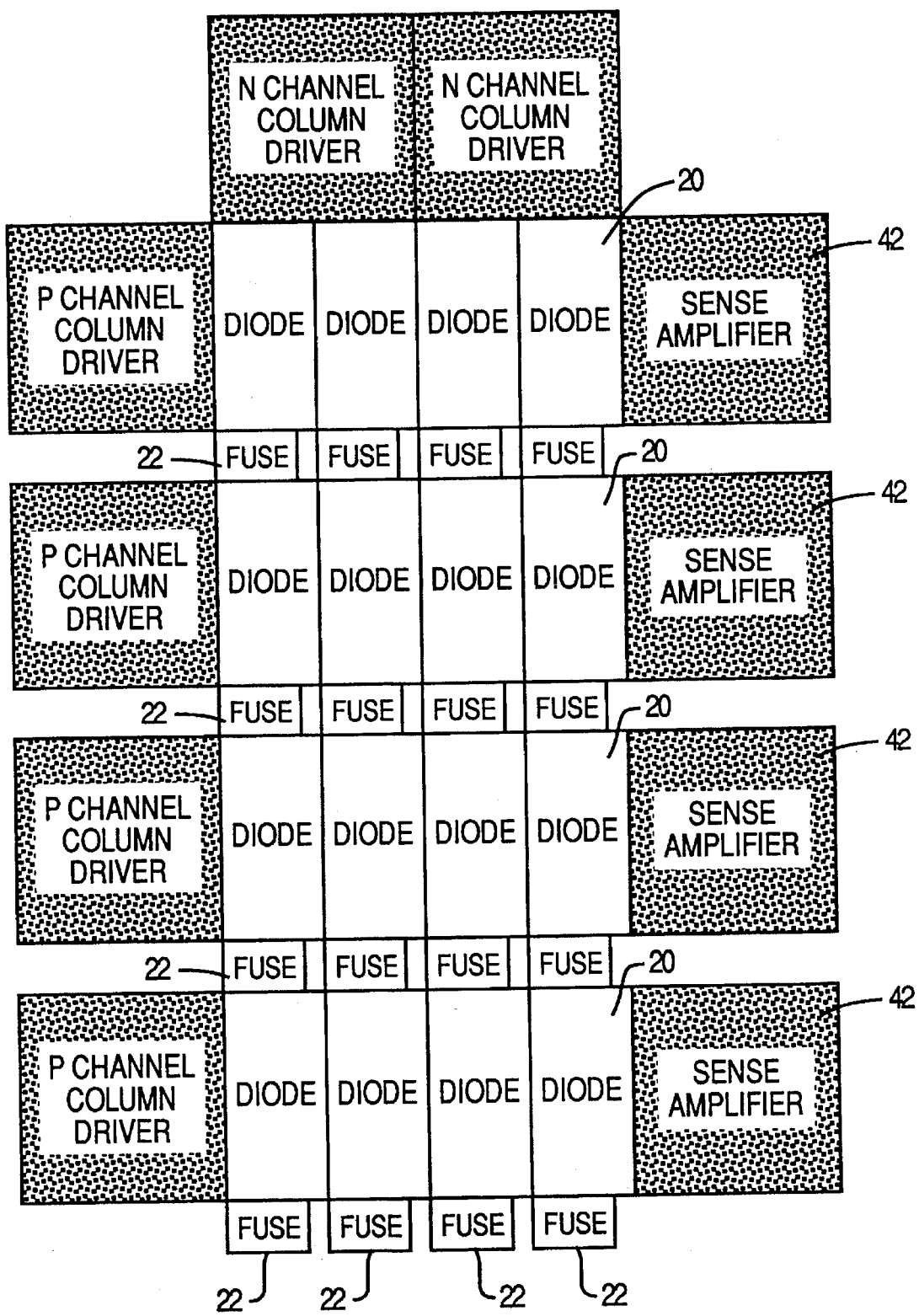
FIG. 4 is a semiconductor layout floorplan for the fuse array structure shown in FIG. 3.

FIG. 4 is a semiconductor layout floorplan for the fuse array structure shown in FIG. 3, manufactured through a standard 1.0 micron process.

A typical aluminum fuse element manufactured with a 1.5 micron process requires a current of 540 milliamperes to blow. Assuming a similar geometry and a temperature of approximately 1400 degrees centigrade for the fuse blowing operation, an estimate of the required current for opening a polysilicon fuse element can be formulated. If the fuse geometry is held constant then the power required to blow the fuse element should be proportional to temperature. The power (P) dissipated in the fuse element can be determined from the following equation:

$$P = I^2 R, \qquad \text{EQN1}$$

where I is the current through the fuse and R is the resistivity of the fuse material which provides the heating.

An aluminum fuse element manufactured with a 1.5 micron (C4) process typically has a resistivity of 0.040 ohms per square. However, a fuse element formed from polysilicon doped with the P+source-drain diffusion used in the CMOS process has a resistivity of approximately 25 ohms per square at room temperature. The current ($I_{poly}$) through a polysilicon fuse element can be determined from the following equation:

$$I_{poly} = I_{A1} (R_{A1}/R_{poly})^{1/2} (Temp_{poly}/Temp_{A1}), \qquad \text{EQN2}$$

where $I_{A1}$ is the current through an aluminum element, $R_{A1}$ is the resistivity of the aluminum element, $R_{poly}$ is the resistivity of the polysilicon element, $Temp_{poly}$ is the temperature of the polysilicon element and $Temp_{A1}$ is the temperature of the aluminum element. The temperature coefficient of resistivity of the polysilicon fuse material is positive at room temperature. However, the resistance of the polysilicon material at its melting point introduces additional incertitude into the current calculation. From equations EQN1 and EQN2 it is seen that power is roughly proportional to the square of the scale factor and the temperature difference.

As stated earlier, the current required to blow an aluminum fuse manufactured with the 1.5 micron process is approximately 540 milliamperes. The current required to blow a polysilicon fuse of similar geometry is approximated through use of the two equations provided above to be 20 milliamperes. Sensing current is approximately 20 microamperes. The three orders of magnitude between these two current values should provide a high degree of reliability for fuses which have not been opened by the programming process.

The semiconductor layout floorplan of FIG. 4 assumes a requirement of 20 milliamperes for programming fuses and a current of one milliampere per grid for N-channel drive transistors. The width of the physical transistor required to program the fuse structure described above is eight grids for the N-channel transistor and eight grids for the P-channel transistor. Fuse element 22 itself occupies an area of two grids by two grids. The series decoupling diode 20 occupies an area of four grids by eight grids. Each grid is sixteen layout units per side, which is 0.036 square mils for the 1.0 micron process.

FIG. 4 shows an array of sixteen fuses (bits). An array of 256 fuses (bits) will occupy a space of 72 by 168 grids, or 12,096 square grids which is 436 square mils. An array of 1024 fuses is 328 by 136 grids or 44,608 square grids which is 1,606 square mils.

A principal attribute of the described fuse array is its write once characteristic. Since the array can be constructed with up to 1024 bits, applications requiring only a few bits can be written several times. For example, in a fuse array including 32, 32 bit words, one word can be utilized to record the number of times the array has been programmed and the 31 remaining words utilized to hold programming data. In this way, the array can be programmed with 32 bits of information a total of 31 times. Such an array may find use in an application such as an electronic lock where the combination of the lock may be changed more than once over the life of the lock.

It can thus be seen that there has been provided by the present invention a cost effective fuse array structure for a PROM having reduced current requirements for programming and reduced incidence of fuse grow back.

Although the presently preferred embodiment of the invention has been described, it will be understood that various changes may be made within the scope of the appended claims.

What is claimed is:

1. A semiconductor structure comprising:

a first electrical conductor;

a second electrical conductor electrically separated from said first electrical conductor;

a polysilicon strip connecting said first and second electrical conductors and forming a fuse between said first and second electrical conductors, said polysilicon strip including a narrow middle section, whereby said fuse will be opened by a current which is passed from said first electrical conductor through said polysilicon strip into said second electrical conductor;

a first patterned signal layer, said first electrical conductor and said polysilicon strip residing in said first patterned signal layer; and a second patterned signal layer electrically separated from said first patterned signal layer, said second electrical conductor residing in said second patterned signal layer.

2. The semiconductor structure according to claim 1, further comprising:

a plated via connecting said second electrical conductor to one end of said polysilicon strip.

3. A semiconductor structure comprising:

a first electrical conductor;

a second electrical conductor electrically separated from said first electrical conductor:

a polysilicon strip connecting said first and second electrical conductors and forming a fuse between said first and second electrical conductors, said polysilicon strip including a narrow middle, whereby said fuse will be opened by a current which is passed from said first electrical conductor through said polysilicon strip into said second electrical conductor:

a first input drive connected to said first electrical conductor for selectively coupling said first electrical conductor to a first reference voltage; and a second input drive connected to said second electrical conductor for selectively coupling said second electrical conductor to a second reference voltage;

whereby a programming current can be established between said first and second reference voltages for opening said polysilicon strip.

4. The semiconductor structure according to claim 3, further comprising:

a pull-up resistor connected between said second voltage source and said second electrical conductor; and a sense amplifier connected to said second electrical conductor for sensing the voltage potential of said second electrical conductor when said first electrical conductor is coupled to said first reference voltage.

5. The semiconductor structure according to claim 4, further comprising:

a diode connected between said polysilicon strip and said first electrical conductor for blocking current flow from said first conductor into said polysilicon strip.

6. The semiconductor structure according to claim 1, wherein said structure is implemented in CMOS technology.

7. A programmable read only memory (PROM) comprising:

a first patterned signal layer;

a second patterned signal layer, said second patterned signal layer being electrically separated from said first patterned signal layer;

a plurality of fuse structures, each one of said fuse structures comprising a polysilicon strip connecting a first electrical conductor residing in said first patterned signal layer with a second electrical conductor residing in said second patterned signal layer and forming a fuse between said first and second electrical conductors, said polysilicon strip including a narrow middle section, whereby said fuse will be opened by a current which is passed from said first electrical conductor through said polysilicon strip into said second electrical conductor.

8. The PROM according to claim 7, wherein:

said plurality of fuse structures are arranged in an array forming at least one row of fuse structures and at least one column of fuse structures.

9. A programmable read only memory (PROM) comprising:

a first patterned signal layer including at least one electrical conductor oriented in a first direction;

a second patterned signal layer being electrically separated from said first signal layer, said second patterned signal layer including at least one electrical conductor oriented in a second direction; and a plurality of fuse structures, each one of said fuse structures comprising a polysilicon strip connecting a first electrical conductor residing in said first patterned signal layer with a second electrical conductor residing in said second patterned signal layer and forming a fuse there between, said polysilicon strip including a narrow middle section, whereby said fuse will be opened by a current which is passed from said first electrical conductor through said polysilicon strip into said second electrical conductor.

10. The PROM according to claim 9, wherein:

said plurality of fuse structures are arranged in an array comprising at least one row of fuse structures oriented in said first direction and at least one column of fuse structures oriented in said second direction;

each row of fuse structures is associated with one of said electrical conductors residing in said first patterned signal layer;

each column of fuse structures is associated with one of said electrical conductors residing in said second patterned signal layer; and each one of said fuse structures connects the electrical conductors associated with its corresponding row and column.

11. The PROM according to claim 10, further comprising:

an address input driver corresponding to each said electrical conductor residing in said first patterned signal layer for selectively coupling its corresponding electrical conductor to a first reference voltage; and a data input driver corresponding to each said electrical conductor residing in said second patterned signal layer for selectively coupling its corresponding electrical conductor to a second reference voltage;

whereby a programming current path can be established between said first and second reference voltages, said current path including a selected one of said electrical conductors residing in said first patterned signal layer and a selected one of said electrical conductors residing in said second patterned signal layer, and the polysilicon strip connecting said selected electrical conductors.

12. The PROM according to claim 11, further comprising:

a pull-up resistor connected between said second reference voltage and each said electrical conductor residing in said second patterned signal layer; and a sense amplifier connected to each said electrical conductor residing in said second patterned signal layer for sensing the voltage potential of said second electrical conductor when an electrical conductor residing in said first patterned signal layer is coupled to said first reference voltage.

13. The semiconductor structure according to claim 12, wherein:

each one of said fuse structures includes a diode connected in series with said polysilicon strip.

* * * * *